United States Patent [19]
Campardo

[11] Patent Number: 5,982,666
[45] Date of Patent: *Nov. 9, 1999

[54] SENSE AMPLIFIER CIRCUIT FOR SEMICONDUCTOR MEMORY DEVICES

[75] Inventor: Giovanni Campardo, Bergamo, Italy

[73] Assignee: STMicroelectronics S.r.l., Agrate Brianza, Italy

[*] Notice: This patent is subject to a terminal disclaimer.

[21] Appl. No.: 09/013,141

[22] Filed: Jan. 26, 1998

Related U.S. Application Data

[63] Continuation of application No. 08/639,192, Apr. 26, 1996, Pat. No. 5,729,492.

[30] Foreign Application Priority Data

Apr. 28, 1995 [EP] European Pat. Off. .............. 95830166

[51] Int. Cl.$^6$ .................................................. G11C 16/06
[52] U.S. Cl. ................................ 365/185.21; 365/185.2; 365/185.13; 365/189.01; 365/189.09
[58] Field of Search ........................... 365/185.21, 185.2, 365/185.13, 189.01, 189.09, 191, 196

[56] References Cited

U.S. PATENT DOCUMENTS

| | | | |
|---|---|---|---|
| 4,264,872 | 4/1981 | Suzuki ..................................... | 330/253 |
| 5,289,419 | 2/1994 | Hashizumi et al. ..................... | 365/203 |
| 5,305,273 | 4/1994 | Jinbo ...................................... | 365/210 |
| 5,729,492 | 3/1998 | Campardo .......................... | 365/185.21 |

FOREIGN PATENT DOCUMENTS

| | | |
|---|---|---|
| 0 505 915 | 9/1992 | European Pat. Off. . |
| 56-111188 | 9/1981 | Japan . |
| 59-180893 | 10/1984 | Japan . |
| 62-252594 | 11/1987 | Japan . |
| 63-046691 | 2/1988 | Japan . |
| 61-76585 | 6/1994 | Japan . |

OTHER PUBLICATIONS

Terada, Y. et al., "120–ns 128 K ×8–bit / 64K ×16–bit CMOS EEPROM's", *IEEE Journal of Solid–State Circuits* 24:1244–1249, Oct. 1989.

Masuoka, F. et al., "A 256–kbit Flash E$^2$PROM Using Triple–Polysilicon Technology," *IEEE Journal of Solid–State Circuits* 22:548–552, Aug. 1987.

*Primary Examiner*—David Nelms
*Assistant Examiner*—Thong Le
*Attorney, Agent, or Firm*—David V. Carlson; Seed and Berry LLP

[57] ABSTRACT

A sense amplifier circuit for a semiconductor memory device comprises first current/voltage conversion means for converting a current of a memory cell to be read into a voltage signal, second current voltage/conversion means for converting a reference current into a reference voltage signal, and voltage comparator means for comparing the voltage signal with the reference voltage signal. The sense amplifier circuit comprises capacitive decoupling means for decoupling the voltage signal from the comparator means, and means for providing the capacitive decoupling means with an electric charge suitable for compensating an offset voltage introduced in the voltage signal by an offset current superimposed on the current of the memory cell to be read.

35 Claims, 4 Drawing Sheets

SENSE AMPLIFIER CIRCUIT FOR SEMICONDUCTOR MEMORY DEVICES

This application is a continuation of application Ser. No. 08/639,192, filed Apr. 26, 1996, now U.S. Pat. No. 5,729,492.

TECHNICAL FIELD

The present invention relates to a sense amplifier circuit for semiconductor memory devices. More specifically, this invention relates to a sense amplifier circuit particularly adapted to Flash EEPROM devices.

BACKGROUND OF THE INVENTION

It is known that a semiconductor memory device comprises a matrix ("memory matrix") of memory cells located at the intersections of rows and columns of the matrix. The rows of the matrix are normally called "word lines", and the columns of the matrix are called "bit lines".

A Flash EEPROM memory cell is comprised of a floating gate MOS field effect transistor with drain and source electrodes, a control gate electrode and a floating gate electrode. The control gate electrode is connected to a respective word line of the memory matrix, the drain electrode is connected to a respective bit line, and the source electrode is connected to a reference potential.

The Flash EEPROM memory cell can be electrically programmed (or "written") and erased. During writing, electrons are transferred onto the floating gate electrode of the floating gate MOSFET by means of the so-called Channel Hot Electron ("CHE") effect. During erasing, electrons are removed from the floating gate electrode by means of Fowler-Nordheim tunneling.

The presence of electron charges on the floating gate electrode modifies the current/voltage characteristic of the floating gate MOSFET. In fact, the threshold voltage of the floating gate MOSFET varies according to the charge on its floating gate electrode. A written memory cell has a threshold voltage higher than that of an erased memory cell.

This difference in threshold voltages is exploited during reading mode to determine if a particular memory cell is erased or written. The word line to which the control gate electrode of the memory cell to be read is connected is raised to a voltage between the threshold voltage of an erased memory cell and that of a written memory cell, and the voltage of the bit line to which the drain electrode of the memory cell is connected is also raised. In these conditions, if the memory cell to be read is a written memory cell, it will not sink current, because the voltage on the control gate electrode of the memory cell is lower than its threshold voltage. If it is an erased memory cell, it will sink current, because the voltage on its control gate electrode is higher than its threshold voltage.

Known sense amplifier circuits substantially comprise current/voltage converters which convert the current sunk by the memory cell to be read into a voltage signal. Typically, this voltage signal is compared with a reference voltage signal obtained by current/voltage conversion of a reference current. The reference current is the current sunk by a so-called "reference memory cell", which is a floating gate MOSFET identical to those constituting the real memory cells, but having a predetermined threshold voltage, corresponding to the so-called "virgin state" (the erased condition achieved by a floating gate MOSFET after it has been submitted to Ultra-Violet light). In this way, all the spurious effects, such as statistical geometrical and process variations between memory cells, voltage variations, and so on, are eliminated, because they give rise to common-mode signals.

A specific problem of Flash EEPROM devices is related to the fact that Flash EEPROM devices are not erased on a per-byte basis, but on a per-sector basis. This means that many memory cells (from thousand to millions) are simultaneously submitted to electrical erasing. Consequently, it is not possible to individually control the behavior of each memory cell during erasing, the only feasible thing being a statistical approach. Slight differences in the electric characteristics of the conductive paths between the memory cells and the voltage rails, as well as in the geometry of the memory cells, determine a statistical distribution of the erasing time of the memory cells, and cause after erasing a dispersion of values of memory cells' electric parameters such as the threshold voltage, the memory cell current, and so on. Therefore, after repeated electrical writing and erasing cycles, some of the floating gate MOSFETs may happen to be overerased to the extent that their threshold voltages (normally positive) become negative.

The existence of even only one overerased, i.e., depleted, memory cell leads to the failure of the whole memory device. In fact, a depleted memory cell sinks a finite current even when it is not selected, i.e., when the voltage on its control gate electrode is zero. When an attempt is made to read a written memory cell belonging to the same bit line as the depleted memory cell, the current sunk by the latter causes the sense amplifier circuit to erroneously read the written memory cell as an erased memory cell. In other words, the current sunk by a depleted memory cell can be regarded as an offset current which adds to the current sunk by the memory cell to be read. This offset current causes an offset voltage to be superimposed on the output voltage signal of the current/voltage converter The offset voltage, if large enough, can be responsible for the incorrect reading of a written memory cell as an erased memory cell.

SUMMARY OF THE INVENTION

In view of the state of the art described, an object of the present invention is to provide a new sense amplifier circuit for semiconductor memory devices in general, and particularly adapted to Flash EEPROM devices in that it is not affected by the presence of depleted memory cells.

According to the present invention, such an object is achieved by means of a sense amplifier circuit for a semiconductor memory device, comprising first current/voltage conversion means for converting a current of a memory cell to be read into a voltage signal, second current voltage/conversion means for converting a reference current into a reference voltage signal, and voltage comparator means for comparing said voltage signal with said reference voltage signal, characterized by comprising capacitive decoupling means for decoupling said voltage signal from said comparator means, and means for providing said capacitive decoupling means with an electric charge suitable for compensating an offset voltage introduced in said voltage signal by an offset current superimposed on the current of the memory cell to be read.

The sense amplifier circuit according to the present invention is not affected by the presence of an offset current, such as that introduced by a depleted memory cell in a Flash EEPROM device, at least as long as such an offset current does not take very high values. In fact, thanks to the provision of said capacitive means between the current-to-voltage converted signal and the comparator, any offset in the converted voltage signal is decoupled from the comparator's input by a DC offset voltage that effectively cancels the offset in the converted voltage signal. Only the fluctuations of the converted voltage signal, corresponding to the current sunk by the memory cell to be read, with respect to such a DC offset voltage are fed to the comparator.

BRIEF DESCRIPTION OF THE DRAWINGS

The features and advantages of the present invention will be made more evident by the following detailed description of two particular embodiments, illustrated as non-limiting examples in the annexed drawings, wherein.

DETAILED DESCRIPTION OF THE INVENTION

Figure 1:
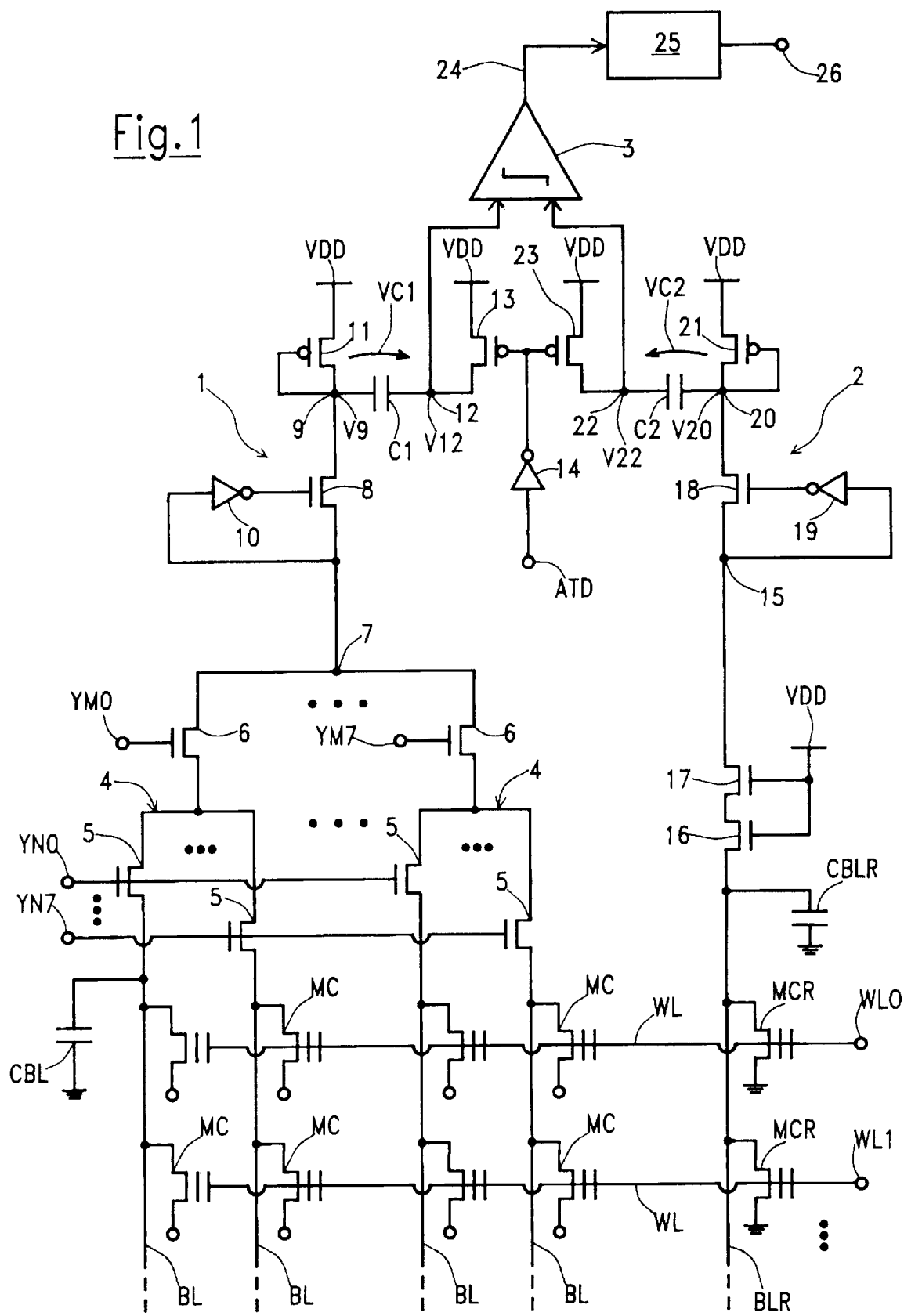
FIG. 1 is a schematic diagram of a sense amplifier circuit according to a first embodiment of the present invention.

As shown in FIG. 1, a sense amplifier circuit according to a first embodiment of the present invention substantially comprises two current/voltage converter branches 1 and 2 and a comparator 3.

A first current/voltage converter branch 1, also called "matrix branch", is coupled to a group of bit lines BL of a matrix of memory cells MC of a semiconductor memory device. In the case of a Flash EEPROM device, each memory cell is represented by a floating gate MOSFET with a drain electrode connected to one respective bit line BL of the matrix, a source electrode commonly connected to the source electrodes of all the other memory cells, and a control gate electrode connected to one respective word line WL of the matrix. The memory cells MC belonging to the bit lines BL which are coupled to the same current/voltage converter branch 1 form a memory portion reserved to an external data line of the memory device. (Flash EEPROM devices generally comprise eight or sixteen external data lines.) According to a known arrangement, the bit lines BL coupled to the same current/voltage converter branch 1 are grouped in a number of packets 4, for example eight, each packet 4 comprising for example eight bit lines BL. Inside each packet 4, each bit line BL is connected to a source electrode of a respective first-level selection N-channel MOSFET 5. The drain electrodes of all the first-level selection MOSFETs 5 inside each packet 4 are commonly connected to a source electrode of a respective second-level selection N-channel MOSFET 6. The drain electrodes of all the second-level selection MOSFETs 6 are commonly connected to a node 7 of the first current/voltage converter branch 1.

A gate electrode of each MOSFET 5 is connected to a respective first-level bit line selection signal YN0–YN7. Similarly, a gate electrode of each MOSFET 6 is connected to a respective second-level bit line selection signal or packet selection signal YM0–YM7. Signals YN0–YN7 and YM0–YM7 are generated in a per-se known way by an address decoding circuitry 50 (FIG. 2) supplied with external address signals A0–An of the memory device. Such address decoding circuitry also generates word line selection signals WL0, WL1, . . . WLm for the selection of the word lines WL.

An N-channel MOSFET 8, typically of the so-called "native" kind, has a source electrode connected to node 7, a drain electrode connected to a node 9 of the first branch 1, and a gate electrode connected to an output of an inverter 10 whose input is connected to node 7. A native transistor has a much lower threshold voltage than an "enhancement" transistor. Typically, the threshold voltage of an enhancement transistor is about 1 V, and that of a native transistor is 0.4–0.5 V. A P-channel MOSFET 11 has a drain electrode connected to node 8, a source electrode connected to a voltage supply line VDD, and a gate electrode connected to node 9. MOSFET 8 and inverter 10 form a so-called "drain voltage regulator" for the memory cells MC, and keep the voltage at node 7 at a value of about 1 V, to prevent soft writing of the memory cells MC during reading.

Node 9 is connected to one plate of a capacitor C1, whose second plate is connected to a node 12 to which a drain electrode of a P-channel MOSFET 13 is also connected. MOSFET 13 has a source electrode connected to the voltage supply line VDD, and a gate electrode connected to an output of an inverter 14, whose input is connected to a signal ATD ("Address Transition Detected"), activated by an address transition detection circuit (FIG. 2) upon recognition of a change in the external address signals of the memory device, as will be explained later on. Node 12 is also connected to one input of the comparator 3.

The second current/voltage converter branch 2 is substantially similar to the first branch 1. Branch 2 is coupled to a so-called "reference" bit line BLR made up of "reference" memory cells MCR. The reference memory cells MCR are totally similar to the memory cells MC, except for the fact that their threshold voltages are set to the value of an UV erased memory cell.

The reference bit line BLR is connected to a node 15 of the second branch 2 through two serially-connected N-channel MOSFETs 16, 17 whose gate electrodes are both connected to the voltage supply line VDD. These two MOSFETs 16 and 17 simulate the effect of the first- and second-level selection MOSFETs 5 and 6 in series to each bit line BL on the first branch 1, in order to have nearly identical or identical electrical paths between the voltage supply line VDD and the memory cells MC and MCR, respectively.

The reference memory cells MCR can be immersed in the matrix of memory cells MC. In alternative, the reference memory cells MCR can be immersed in a little matrix of reference memory cells external to the matrix of memory cells MC.

Similarly to node 7 in the first branch 1, node 15 is connected to a drain voltage regulator comprising an N-channel MOSFET 18 (native kind) and an inverter 19. A drain electrode of MOSFET 18 is connected to a node 20 of the second branch 2 to which a drain electrode of a P-channel MOSFET 21 is also connected. MOSFET 21 has a source electrode connected to the voltage supply line VDD, and a gate electrode connected to node 20. A capacitor C2 has one plate connected to node 20, and a second plate connected to a node 22 to which a drain electrode of a P-channel MOSFET 23 is also connected. MOSFET 23 has a source electrode connected to VDD and a gate electrode connected to the output of the inverter 13. Node 22 is further connected to a second input of the comparator 3.

An output 24 of the comparator 3 is supplied to a latch 25, whose output 26 is supplied to a conventional output buffer (not shown) which drives a respective external data line (not shown).

Figure 2:
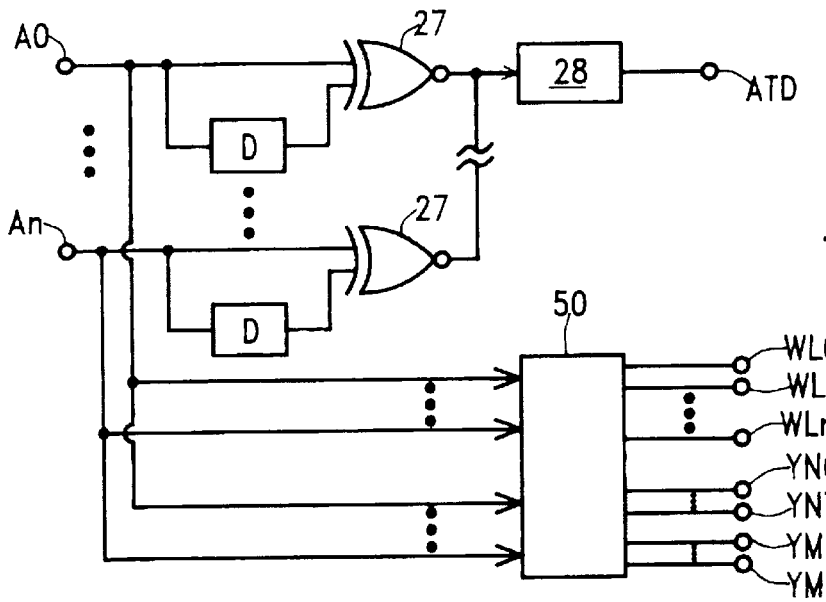
FIG. 2 is a schematic diagram of an address transition detection circuit for the control of the sense amplifier circuit of FIG. 1.

As shown in FIG. 2, the Flash EEPROM device is also provided with an address transition detection circuit. Each external address signal A0–An supplies directly a first input of a XNOR (exclusive NOR) logic gate 27 and, through a delay line D, a second input of the XNOR gate 27. The outputs of all the XNOR gates 27 are commonly connected and supplied to an input of a monostable circuit 28; the output of the monostable circuit 28 forms the signal ATD.

Upon a logic state transition of even only one of the external address signals A0–An, an ATD pulse of a predetermined duration is produced at the output of the monostable circuit 28.

FIGS. 3A–3D show the relative timing of signals during a read operation of a written memory cell and of an erased memory cell.

Figure 3A:
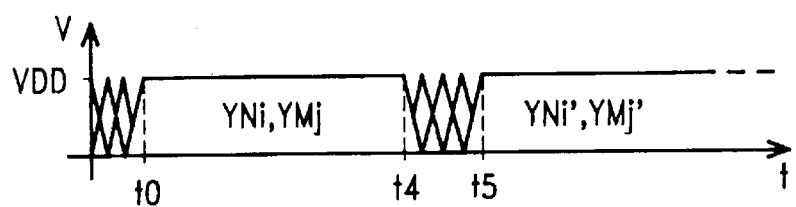
FIGS. 3A to 3D are timing diagrams of some signals of the sense amplifier circuit of FIG. 1.
Figure 3B:
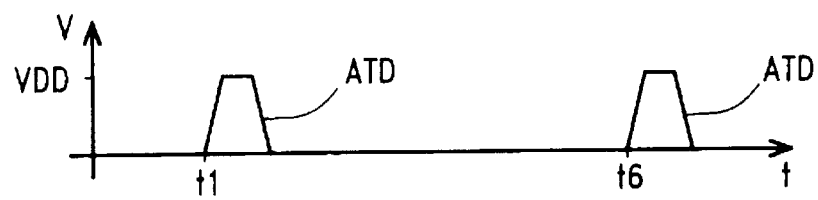

A read operation starts when the logic configuration of the external address signals A0–An changes. At the instant t0, one (YNi) of the first-level selection signals YN0–YN7 and one (YMj) of the second-level selection signals YM0–YM7 are activated by the address decoding circuitry 50 (FIG. 3A). Which of the signals YN0–YN7 and YM0–YM7 is actually activated depends on the particular logic configuration of the external address signals A0–An. One of the first-level selection MOSFETs 5 and one of the second-level selection MOSFETs 6 are turned on, so that the bit line BL which contains the memory cell to be read is connected to the node 7 of the current/voltage converter branch 1. The reference bit line BLR is instead permanently connected to node 15 of the second converter branch 2.

Since none of the word line selection signals WL0–WLm is activated, no current will flow in the second converter branch 2, and the voltages V20 at node 20 and V22 at node 22 are therefore equal to VDD. If no depleted (i.e., negative threshold voltage) memory cells are present in the selected bit line BL, a transient current will run through the first converter branch I until a parasitic capacitance CBL of the selected bit line BL is charged to the voltage set by the drain voltage regulator made from transistor 8 and inverter 10. As the parasitic capacitance CBL is charged, the voltages V9 at node 9 and V12 at node 12 rise towards VDD.

As long as MOSFETs 13 and 23 are off, nodes 12 and 22 are floating, being connected only to the high-impedance inputs of the comparator 3.

Alternatively, if one or more of the memory cells MC of the selected bit line BL are depleted, the depleted memory cells sink a finite current even if their gate voltage is zero. Consequently, even after the parasitic capacitance CBL of the bit line has been charged, a current will continue to flow in the first converter branch 1. Such a current can be regarded as an offset current which causes the voltage V9 to set at a value lower than VDD, due to the voltage drop across MOSFET 11. The difference between VDD and the actual voltage V9 is an offset voltage. In conventional sense amplifier circuits, such an offset current could be responsible, if sufficiently high, for an erroneous reading of a written memory cell for an erased memory cell.

The change in the address signals A0–An also produces, at an instant t1 (FIG. 3B), the generation of an address transition detection pulse in the signal ATD. The ATD pulse turns the P-channel MOSFETs 13 and 23 on, to connect nodes 12 and 22 to VDD. If no depleted memory cells are present in the selected bit line BL, capacitor C1 charges to a voltage VC1 equal to zero. If instead the selected bit line BL contains depleted memory cells, capacitor C1 will charge to a voltage VC1 equal to the difference between the voltage V12 at node 12 (VDD) and the voltage V9, this last depending on the offset current introduced by the depleted memory cells. The ATD pulse has a predetermined duration at least sufficient to assure that capacitor C1 is completely charged. Capacitor C2 charges to a voltage VC2 substantially equal to zero, since both its plates are at VDD.

When the ATD pulse ends, MOSFETs 13 and 23 turn off, and nodes 12 and 22 are disconnected from VDD, and are thus left substantially floating, since they are connected to the inputs of the comparator 3.

Figure 3C:
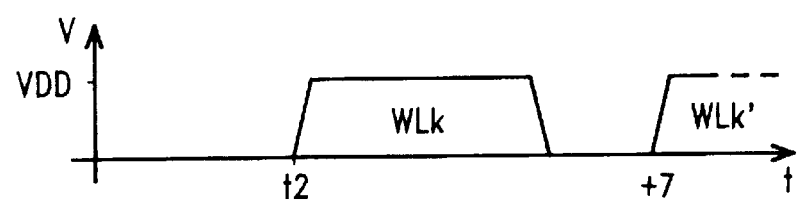
Figure 3D:
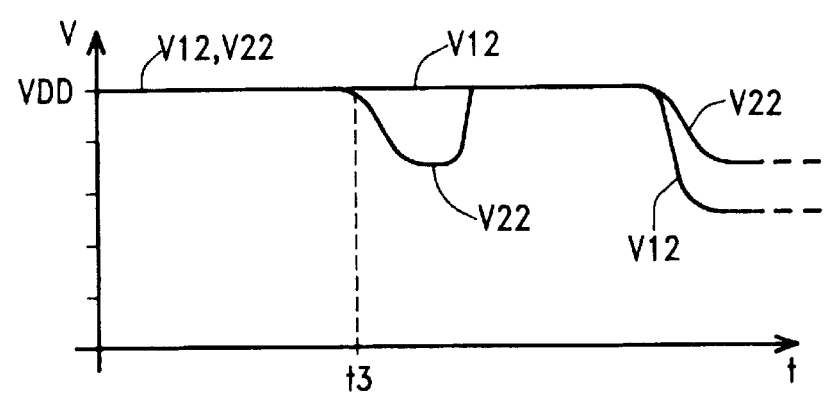

At an instant t2, after the end of the ATD pulse, the address decoding circuitry 50 activates one (WLk) of the word line selection signals WL0, WL1 . . . WLn (FIG. 3C). The voltage of the selected word line WL is raised to VDD. One of the reference memory cells MCR of the reference bit line BLR is turned on and starts sinking current. This causes a drop in the voltage at node 20; since no discharge paths exist for capacitor C2, the voltage V22 at node 22 follows the voltage V20, and sets to a value determined by the dimensional ratio between MOSFET 21 and the reference memory cell MCR (FIG. 3D).

Since it is supposed that the memory cell MC connected to the selected bit line BL and word line WL is a written memory cell, the voltage VDD on its control gate electrode is not sufficient to turn it on, and it will not sink current. The voltage V9 does not vary, and also the voltage V12 substantially remains at the VDD level. The voltage V12 is higher than the voltage at node 22. This voltage difference is detected by comparator 3, whose output 24 switches to, for example, the "0" logic level. This logic level is stored in the latch 25, which drives the respective external data line, typically by means of the output buffer circuit (not shown) to deliver the read datum.

Suppose now that at an instant t4, the logic configuration of the external address signals A0–An changes, to start a new read operation. The word line selection signal WLk is deactivated. At an instant t5 one ($YNi^1$, $YMj^1$) of the first- and second-level selection signals YN0–YN7 and YM0–YM7 are activated, to connect a new bit line BL to the converter branch 1. At an instant t6 the ATD pulse starts, and at an instant t7, successive to the end of the ATD pulse, one ($WLk^1$) of the word line selection signals WL0, WL1 . . . WLm is activated to select a new word line.

Since it is now supposed that the memory cell MC connected to the selected bit line BL and word line BL is now an erased memory cell, the voltage VDD on its control gate electrode turns it on, and the cell sinks current. This current adds to the offset current introduced by the depleted memory cells (if they are present) and causes a further drop in the voltage V9 since capacitor C1 has no discharge paths, the voltage V12 follows the voltage V9, and drops below the voltage V22, because the current sunk by an erased memory cell MC is higher than that sunk by the UV-erased reference memory cell MCR. The output 24 of the comparator 3 switches to the "1" logic level, and this logic level is stored in the latch 25.

Capacitor C1 decouples node 12 from node 9. During the ATD pulse, capacitor C1 is charged to a voltage VC1, which compensates the offset voltage introduced in the first converter branch 1 by any offset current of depleted memory cells. Thus, the voltage V12 is the same as if no depleted memory cells were present.

It is important to note that for a correct working of the sense amplifier circuit previously described, it is necessary not to have an overlap between the ATD pulse and the word line selection signal WL0, WL1, . . . WLm. In fact, it is necessary for capacitor C1 to be charged to a voltage VC1 compensating the voltage drop produced at node 9 by the offset current only. Furthermore, the ATD pulse must be long enough to assure that capacitor C1 is completely charged.

The latch 25 is necessary to prevent spurious transitions of the external data line caused by the slow discharge of capacitor C1 by means of leakage currents.

Those skilled in the art will surely recognize that the speed performances of the previously described sense amplifier circuit, as well as of the amplifier circuit according to the known art, are mainly limited by the long settling time of V20 due to the slow discharge of a parasitic capacitor CBLR associated with the reference bit line BLR.

Figure 4:
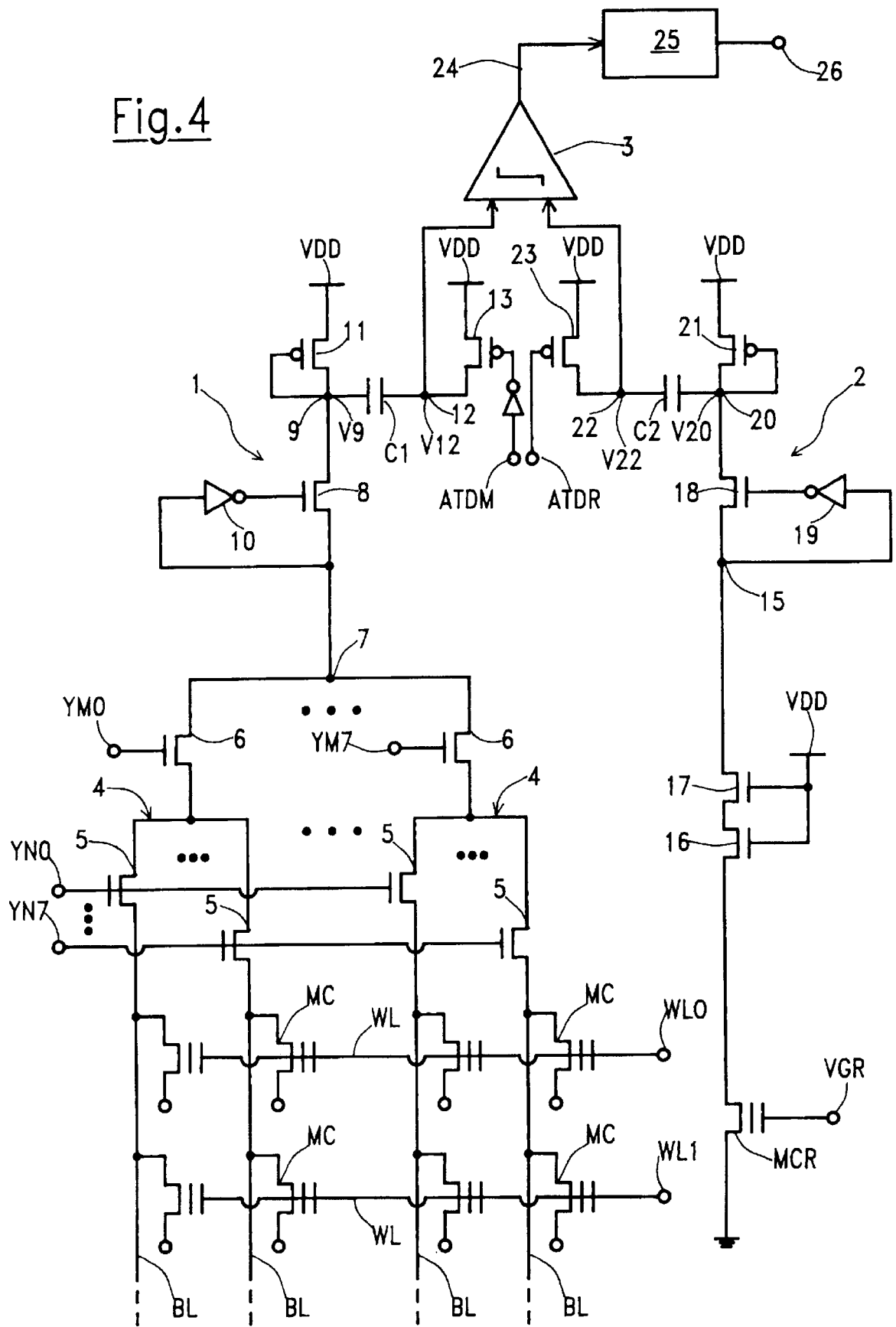
FIG. 4 is a schematic diagram of a sense amplifier circuit according to a second embodiment of the present invention.
Figure 6A:
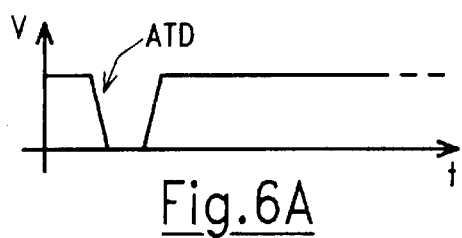
FIGS. 6A to 6G are timing diagrams of some signals of the sense amplifier circuit of FIG. 4 and of the address transition detection circuit of FIG. 5.
Figure 6B:
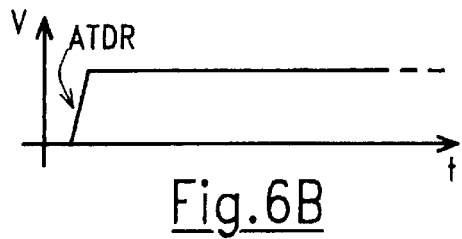
Figure 6C:
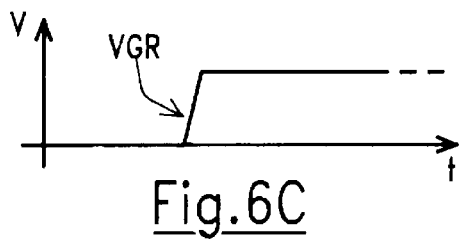
Figure 6D:
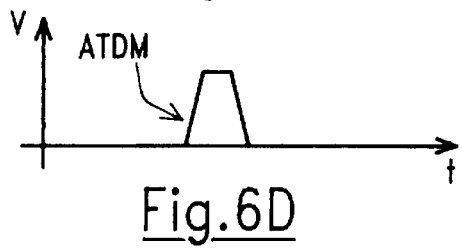
Figure 6E:
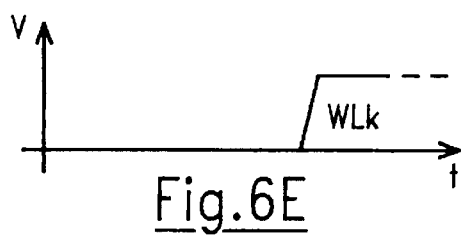

FIG. 4 shows an alternative embodiment of a sense amplifier circuit according to the present invention, having improved speed performances. In this embodiment, the reference bit line BLR of reference memory cells MCR has been replaced by a single memory cell MCR external to the matrix of memory cells MC. The external reference memory cell MCR is driven by a signal VGR, which has a different timing with respect to the word line selection signals WL0, WL1 . . . WLm (FIGS. 6C and 6E). Also, P-channel MOSFETs 13 and 23 are controlled by two distinct address transition detection signals ATDM and ATDR with a different timing, as visible in FIGS. 6B and 6D.

This arrangement allows a reduction in the time required to carry on a sensing operation. In fact, having replaced the reference bit line BLR with a single reference memory cell MCR, the time necessary to the voltage V20 to stabilize is lower, since the parasitic capacitance associated to the reference memory cell MCR is much lower than that of CBLR in the previous embodiment. Furthermore, the reference memory cell MCR is now activated before the activation of one (WLk) of the word line selection signals WL0, WL1–WLm, so that when the memory cell to be read is activated, the voltage V22 is already settled. This further reduces the time required for sensing a memory cell.

Figure 5:
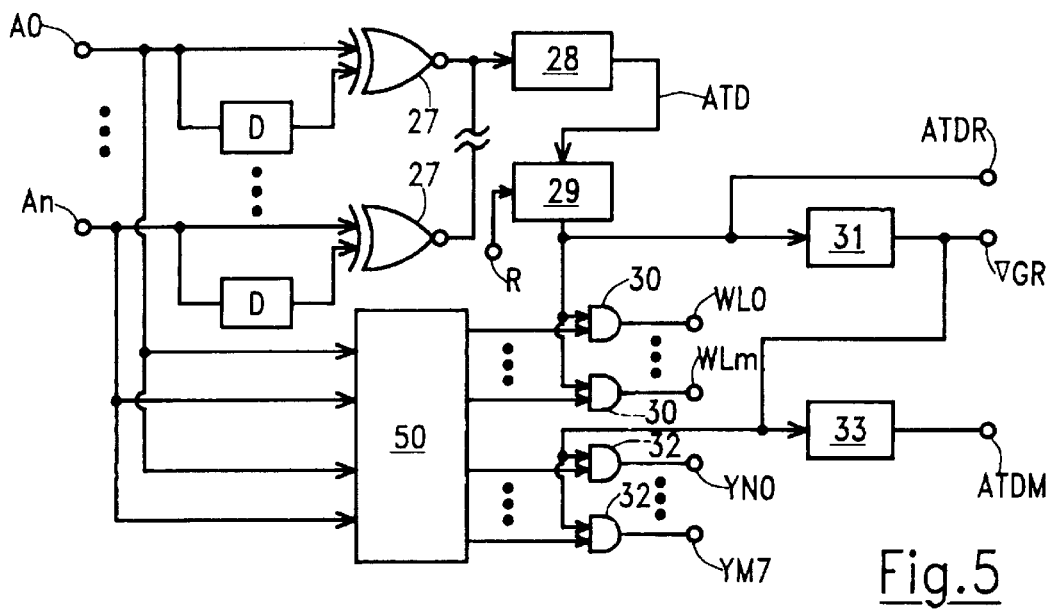
FIG. 5 is a schematic diagram of an address transition detection circuit for the control of the sense amplifier circuit of FIG. 4.

FIG. 5 shows a schematic diagram of an address transition detection circuit for the sense amplifier circuit according to this second embodiment.

The ATD signal supplies a latch 29, whose output forms the signal ATDR driving the MOSFET 23 of the second converter branch 2. The latch 29 is also supplied with a reset signal R which, at the end of each reading, resets the content of the latch 29. Also, the output of latch 29 is commonly supplied as a first input to a number of two-inputs AND gates 30 whose second inputs are supplied with a respective one of the word line selection signals generated by the address decoding circuitry 50, and whose outputs form the signals WL0–WLm. The signal ATDR is further supplied to a delay circuit 31 whose output forms the gate signal VGR driving the reference memory cell MCR. The output of the delay circuit 31 is also commonly supplied as a first input to a plurality of two-inputs AND gates 32 whose second inputs are supplied with a respective one of the first- and second-level column selection signals generated by the address decoding circuitry 50, and whose outputs form the signals YN0–YN7, YM0–YM7. The signal VGR is further supplied to a monostable circuit 33 whose output forms the signal ATDM driving the MOSFET 13 of the first converter branch 1.

Figure 6F:
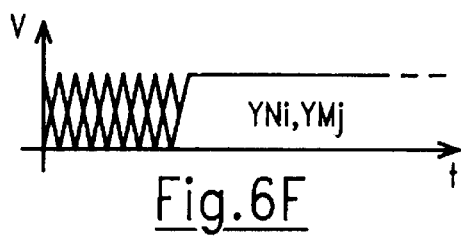
Figure 6G:
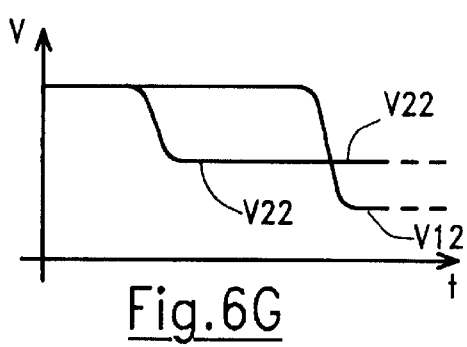

As in the circuit of FIG. 2, the ATD signal is generated by a transition in at least one of the external address signals A0–An. The activation of the ATD signal (FIG. 6A) causes the activation of the signal ATDR (FIG. 6B), which goes high and remains in this state until the reading of the memory cell has been completed (i.e., until the reset signal R resets it to the low logic state). The signal ATDR, going high, turns the MOSFET 23 off, thus leaving node 22 floating. The signal VGR is activated after a predetermined delay, and goes high (FIG. 6C), thus enabling the signals YNi, YMj to go high (FIG. 6F). Also, the signal VGR starts an ATDM pulse (FIG. 6D) at the output of the monostable circuit, which activates the MOSFET 13 connecting node 12 to VDD. The length of the ATDM pulse is such that MOSFET 13 turns off before one (WLk) of the signals WL0, WL1, . . . WLm is activated (FIG. 6E). FIG. 6G shows the voltages V22 and V12 relative to each other when the memory cell to be read is in an erased state.

From the foregoing it will be appreciated that, although specific embodiments of the invention have been described herein for purposes of illustration, various modifications may be made without deviating from the spirit and scope of the invention. Accordingly, the invention is not limited except as by the appended claims.

I claim:

1. A read circuit for reading a memory cell that is coupled to a bit line, the read circuit comprising:
   a comparator having first and second input terminals and having an output terminal that provides a data signal;
   a reference-signal generator coupled to the first input terminal of the comparator; and
   an offset-remove circuit coupled to the comparator and to the bit line, the offset-remove circuit operable to generate a read signal on the second input terminal of the comparator by removing an offset signal from a total signal on the bit line.

2. The read circuit of claim 1 wherein the reference-signal generator comprises a reference memory cell.

3. The read circuit of claim 1 wherein the reference-signal generator comprises a reference memory cell having a threshold that is substantially equal to a threshold of a memory cell that has been erased by exposure to ultra-violet light.

4. The read circuit of claim 1 wherein the offset-remove circuit is operable to remove the offset signal by capacitively coupling the bit line to the second input terminal of the comparator.

5. The read circuit of claim 1 wherein the offset signal has a value substantially equal to zero.

6. The read circuit of claim 1 wherein the offset-remove circuit comprises:
   a capacitor having a first terminal coupled to the bit line and having a second terminal coupled to the second input terminal of the comparator; and
   a switch coupled to the second terminal of the capacitor, the switch operable to allow charging of the capacitor to a voltage equal to a difference between a steady-state voltage on the bit line and a reference voltage before the memory cell is activated for reading, the voltage on the capacitor representative of the offset signal.

7. The read circuit of claim 1, further comprising:
   a supply terminal operable to be coupled to a supply voltage; and
   wherein the offset-remove circuit comprises:
      a capacitor having a first terminal coupled to the bit line and having a second terminal coupled to the second input terminal of the comparator; and
      a switch coupled to the second terminal of the capacitor and to the supply terminal, the switch operable to allow charging of the capacitor to a voltage equal to a difference between a steady-state voltage on the bit line and the supply voltage before the memory cell is activated for reading, the voltage on the capacitor representative of the offset signal.

8. A read circuit for reading a memory cell that is coupled to a bit line, the sense-amplifier circuit comprising:
   a comparator having first and second input terminals and having an output terminal that provides a data signal;
   a reference-signal generator coupled to the first input terminal of the comparator; and
   an offset-remove circuit coupled to the bit line and to the comparator, the offset-remove circuit operable to generate a read signal and provide the read signal to the second input terminal of the comparator, the read signal representing a read current that equals a difference between an offset current and a total current that flow through the bit line during a read of the memory cell.

9. The read circuit of claim 8 wherein the offset-remove circuit comprises a capacitor having a first terminal coupled to the bit line and having a second terminal coupled to the second input terminal of the comparator.

10. The read circuit of claim 8 wherein the offset current comprises a steady-state current.

11. The read circuit of claim 8 wherein the offset-remove circuit comprises:
   a capacitor having a first terminal coupled to the bit line and having a second terminal coupled to the second input terminal of the comparator; and
   a switch coupled to the second terminal of the capacitor, the switch operable to allow charging of the capacitor to an offset voltage that represents the offset current.

12. The read circuit of claim 8, further comprising:
   a supply terminal operable to be coupled to a supply voltage;
   wherein the offset current generates a resulting voltage on the bit line; and
   wherein the offset-remove circuit comprises:
      a capacitor having a first terminal coupled to the bit line and having a second terminal coupled to the second input terminal of the comparator; and
      a switch coupled to the second terminal of the capacitor and to the supply terminal, the switch operable to allow charging of the capacitor to an offset voltage equal to a difference between the resulting voltage and the supply voltage.

13. A read circuit for reading a memory cell that is coupled to a bit line, the sense-amplifier circuit comprising:
   a comparator having first and second input terminals and having an output terminal that provides a data signal;
   a reference-signal generator coupled to the first input terminal of the comparator; and
   an offset-remove circuit coupled to the bit line and to the comparator, the offset-remove circuit operable to generate a read signal and provide the read signal to the second input terminal of the comparator, the read signal representing a read voltage that equals a difference between an offset voltage and a total voltage that are on the bit line during a read of the memory cell.

14. The read circuit of claim 13 wherein the offset-remove circuit is operable to generate the read signal by storing the offset voltage on a capacitor and coupling the bit line to the second input terminal of the comparator through the capacitor.

15. The read circuit of claim 13 wherein the offset-remove circuit comprises a capacitor having a first terminal coupled to the bit line and having a second terminal coupled to the second input terminal of the comparator.

16. The read circuit of claim 13 wherein the offset voltage comprises a steady-state voltage.

17. The read circuit of claim 13 wherein the offset-remove circuit comprises:
   a capacitor having a first terminal coupled to the bit line and having a second terminal coupled to the second input terminal of the comparator; and
   a switch coupled to the second terminal of the capacitor, the switch operable to allow charging of the capacitor to the offset voltage.

18. The read circuit of claim 13, further comprising:
   a supply terminal operable to be coupled to a supply voltage; and
   wherein the offset-remove circuit comprises:
      a capacitor having a first terminal coupled to the bit line and having a second terminal coupled to the second input terminal of the comparator; and
      a switch coupled to the second terminal of the capacitor and to the supply terminal, the switch operable to allow charging of the capacitor to the offset voltage, which equals a difference between the supply voltage and a voltage on the bit line before the memory cell is read.

19. A read circuit for reading a memory cell that is coupled to a bit line, the read circuit comprising:
   a comparator having first and second input terminals and having an output terminal that provides a data signal;
   a reference-signal generator coupled to the first input terminal of the comparator; and
   a capacitor having a first terminal coupled to the bit line and a second terminal coupled to the second input terminal of the comparator.

20. The read circuit of claim 19, further comprising a switch coupled to the second terminal of the capacitor and operable to allow the capacitor to charge to an offset voltage.

21. The read circuit of claim 19, further comprising:
   a supply terminal;
   a first load having a first terminal coupled to the supply terminal and having a second terminal coupled to the bit line;
   a second load having a first terminal coupled to the supply terminal and having a second terminal coupled to the second input terminal of the comparator; and
   a switch having a control terminal operable to receive a control signal, a first terminal coupled to the supply terminal, and a second terminal coupled to the second terminal of the capacitor, the switch operable to allow the capacitor to charge to an offset voltage when the control signal activates the switch.

22. A method for reading data stored in a memory cell that is coupled to a bit line, the method comprising:
   generating a reference signal;
   activating the memory cell so that a total signal is generated on the bit line;
   removing an offset signal from the total signal to generate a read signal; and
   comparing the reference and read signals to generate a data signal that represents the stored data.

23. The method of claim 22 wherein the generating comprises activating a reference memory cell having an ultra-violet-exposed threshold.

24. The method of claim 22 wherein the removing comprises subtracting the offset signal from the total signal.

25. The method of claim 22 wherein the removing comprises:
  storing the offset signal; and
  subtracting the stored offset signal from the total signal.

26. The method of claim 22 wherein the offset signal substantially equals zero.

27. A method for reading data stored in a memory cell that is coupled to a bit line, the method comprising:
  generating a reference current;
  activating the memory cell so that a total current is generated on the bit line;
  removing an offset current from the total current to generate a read current; and
  comparing the reference and read currents to generate a data signal that represents the stored data.

28. The method of claim 27 wherein the removing comprises subtracting the offset current from the total current to generate the read current.

29. The method of claim 27 wherein:
  the removing comprises:
  converting the offset and total currents to offset and total voltages; and
  converting the read current to a read voltage by subtracting the offset voltage from the total voltage; and
  the comparing comprises:
    converting the reference current to a reference voltage; and
    comparing the reference and read voltages to generate the reference signal.

30. The method of claim 27 wherein:
  the removing comprises:
    converting the offset and total currents to offset and total voltages; and
    storing the offset voltage on a capacitor; and
  the comparing comprises:
    converting the reference current to a reference voltage; and
    coupling the reference voltage to a first input terminal of a comparator, coupling the bit line to a second input terminal of the comparator through the capacitor, and generating the data signal with the comparator.

31. The method of claim 27 wherein the offset current substantially equals zero.

32. A method for reading data stored in a memory cell that is coupled to a bit line, the method comprising:
  generating a reference voltage;
  activating the memory cell so that a total voltage is generated on the bit line;
  removing an offset voltage from the total voltage to generate a read voltage; and
  comparing the reference and read voltages to generate a data signal that represents the stored data.

33. The method of claim 32 wherein the generating comprises activating a reference memory cell having an ultra-violet-exposed threshold.

34. The method of claim 32 wherein:
  the removing comprises storing the offset voltage on a capacitor; and
  the comparing comprises coupling the reference voltage to a first input terminal of a comparator, coupling the bit line to a second input terminal of the comparator through the capacitor, and generating the data signal with the comparator.

35. The method of claim 32 wherein the offset voltage substantially equals zero.

* * * * *